United States Patent
Kwack

(10) Patent No.: US 8,908,467 B2
(45) Date of Patent: Dec. 9, 2014

(54) SEMICONDUCTOR MEMORY APPARATUS AND SEMICONDUCTOR SYSTEM INCLUDING THE SAME

(75) Inventor: Seung Wook Kwack, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 631 days.

(21) Appl. No.: 13/181,851

(22) Filed: Jul. 13, 2011

(65) Prior Publication Data
US 2012/0120743 A1  May 17, 2012

(30) Foreign Application Priority Data
Nov. 17, 2010 (KR) .......................... 10-2010-0114406

(51) Int. Cl.
*G11C 8/00* (2006.01)
*G11C 7/10* (2006.01)
*G11C 7/22* (2006.01)

(52) U.S. Cl.
CPC ............ *G11C 7/1009* (2013.01); *G11C 7/1063* (2013.01); *G11C 7/22* (2013.01); *G11C 7/222* (2013.01)
USPC .............. 365/233.13; 365/193; 365/230.05; 365/233.19

(58) Field of Classification Search
CPC ...... G11C 7/1042; G11C 7/1048; G11C 7/18; G11C 8/12; G11C 29/1201; G11C 29/48; G11C 7/22; G11C 7/222
USPC .................... 365/191, 192, 194, 193, 233.13, 365/233.19, 230.05
See application file for complete search history.

(56) References Cited

FOREIGN PATENT DOCUMENTS

KR    10-2009-0020996 A    2/2009

*Primary Examiner* — Hien Nguyen
(74) *Attorney, Agent, or Firm* — William Park & Associates Patent Ltd.

(57) ABSTRACT

A semiconductor memory apparatus includes a shared pad which is configured to output a read operation control signal in a read operation and receive a write operation control signal in a write operation.

19 Claims, 5 Drawing Sheets

SEMICONDUCTOR MEMORY APPARATUS AND SEMICONDUCTOR SYSTEM INCLUDING THE SAME

CROSS-REFERENCES TO RELATED APPLICATION

The present application claims priority under 35 U.S.C. §119(a) to Korean application number 10-2010-0114406, filed on Nov. 17, 2010, in the Korean Intellectual Property Office, which is incorporated herein by reference in its entirety as set forth in full.

BACKGROUND

1. Technical Field

The present invention relates to a semiconductor memory apparatus and a semiconductor system including the same.

2. Related Art

A semiconductor memory apparatus includes a plurality of pads (or pins) and communicates with an external controller through the plurality of pads. While the pads are essential component elements of the semiconductor memory apparatus for communicating with the external controller, the presence of the pads may adversely influence the miniaturization of the semiconductor memory apparatus. That is to say, as a semiconductor memory apparatus has large capacity, the number of pads increases, and the area occupied by the pads correspondingly increases.

FIG. 1 is a diagram schematically illustrating the configuration of a known semiconductor memory apparatus. FIG. 1 shows four pads which are used in the data input/output operations, that is, read and write operations, of a semiconductor memory apparatus. The four pads are a data pad 10, a read data strobe pad 20, a write data strobe pad 30, and a data mask pad 40.

The data pad 10 is provided to input data DQ<0:31> to the semiconductor memory apparatus or output data DQ<0:31> from the semiconductor memory apparatus.

The read data strobe pad 20 is a pad for outputting a read data strobe signal RDQS<0:3> outputted with the read data, to be used in capturing the read data at a receiver, e.g., an external controller.

The write data strobe pad 30 is a pad for receiving a write data strobe signal WDQS<0:3> received with the write data, to be used in capturing the write data at the semiconductor memory apparatus The data mask pad 40 is a pad for receiving a data mask signal DM<0:3>. The data mask signal DM<0:3> is used in the write operation of the semiconductor memory apparatus. The data mask signal DM<0:3> functions to prevent data, currently inputted to the semiconductor memory apparatus through the data pad 10, from being transferred to an internal circuit of the semiconductor memory apparatus, when a change of the data stored in the semiconductor memory apparatus is not required depending upon a data pattern.

FIG. 2 is a timing diagram illustrating the operations of the known semiconductor memory apparatus. The operations of the known semiconductor memory apparatus will be described below with reference to FIGS. 1 and 2. In FIG. 2, a write command WT is inputted for the write operation of the semiconductor memory apparatus. If the write command WT is inputted, the semiconductor memory apparatus receives input data DQ<0:31> through the data pad 10, the write data strobe signal WDQS<0:3> through the write data strobe pad 30, and the data mask signal DM<0:3> through the data mask pad 40. In FIG. 2, if the data mask signal DM<0:3> is enabled, currently inputted data is masked, and if the data mask signal DM is disabled, the currently inputted data is not masked.

Thereafter, when performing the read operation, a read command RD is applied to the semiconductor memory apparatus. If the read command RD is applied, output data DQ<0:31> is outputted to the external controller through the data pad 10, and the read data strobe signal RDQS<0:3> is outputted to the external controller through the read data strobe pad 20.

SUMMARY

A semiconductor memory apparatus which can decrease the number of pads and a semiconductor system which can decrease the number of communication channels are described herein.

In one embodiment of the present invention, a semiconductor memory apparatus includes a shared pad which is configured to output a read operation control signal in a read operation and receive a write operation control signal in a write operation.

In another embodiment of the present invention, a semiconductor memory apparatus includes: a shared pad; a read data strobe generation unit configured to output a read data strobe signal to the shared pad in a read operation; and a mask signal buffering unit configured to buffer a data mask signal received through the shared pad and generate an internal data mask signal in a write operation.

In still another embodiment of the present invention, a semiconductor memory apparatus includes: a shared pad; and a data pad, wherein data is outputted through the data pad and a read operation control signal is outputted through the shared pad in a read operation, and wherein data is received through the data pad and a write operation control signal is received through the shared pad in a write operation.

In still another embodiment of the present invention, a semiconductor system includes: a controller configured to transmit a write command, input data, a data mask signal and a write data strobe signal in a write operation, and transmit a read command in a read operation; and a semiconductor memory apparatus configured to receive the write command, the input data, the data mask signal and the write data strobe signal in the write operation, and receive the read command and transmit output data and a read data strobe signal to the controller in the read operation, wherein the semiconductor memory apparatus receives the data mask signal and outputs the read data strobe signal through a shared pad.

In still another embodiment of the present invention, a semiconductor system includes: a controller; a semiconductor memory apparatus; a command channel; a data channel; a write data strobe channel; and a shared channel, wherein, in a write operation, the controller transmits to the semiconductor memory apparatus a write command through the command channel, input data through the data channel, a write data strobe signal through the write data strobe channel, and a data mask signal through the shared channel, and wherein, in a read operation, the controller transmits to the semiconductor memory apparatus a read command through the command channel and receives from the semiconductor memory apparatus output data through the data channel and a read data strobe signal through the shared channel.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a semiconductor system including the same according to the present invention will be described below with reference to the accompanying drawings through exemplary embodiments.

Figure 1:
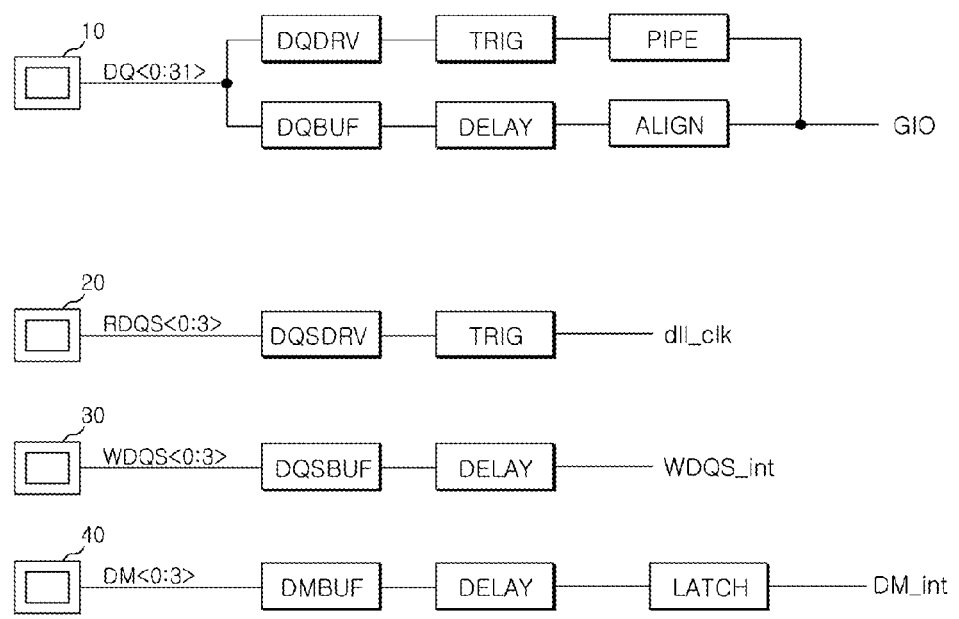
FIG. 1 is a diagram schematically illustrating the configuration of a known semiconductor memory apparatus.
Figure 2:
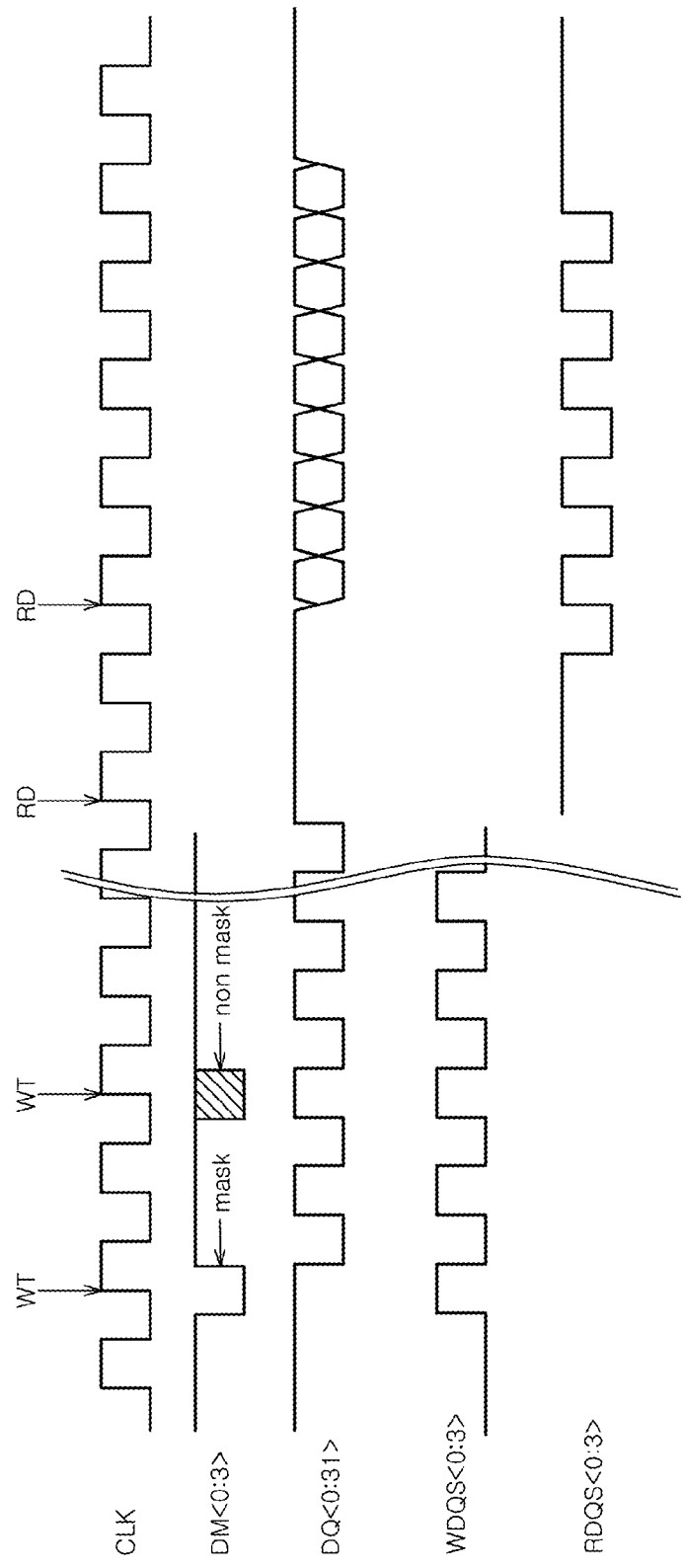
FIG. 2 is a timing diagram illustrating the operations of the known semiconductor memory apparatus.
Figure 3:
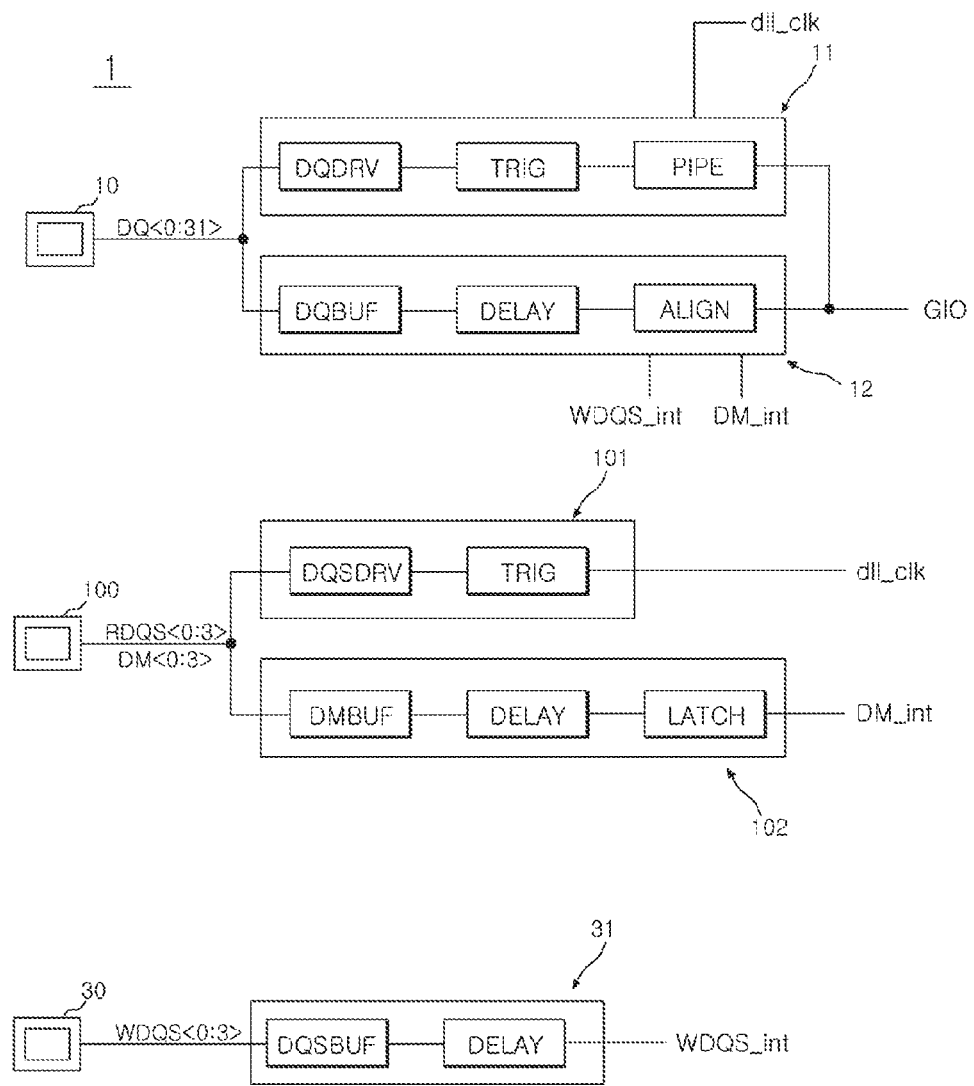
FIG. 3 is a diagram schematically illustrating the configuration of a semiconductor memory apparatus in accordance with an embodiment of the present invention.

FIG. 3 is a diagram schematically illustrating the configuration of a semiconductor memory apparatus in accordance with an embodiment of the present invention. In FIG. 3, the semiconductor memory apparatus 1 includes a shared pad 100, a data pad 10, and a write data strobe pad 30.

The shared pad 100 may output a read operation control signal associated with a read operation of the semiconductor memory apparatus 1, and may receive a write operation control signal associated with a write operation of the semiconductor memory apparatus 1. Accordingly, the shared pad 100 is used in both of the read operation and the write operation of the semiconductor memory apparatus 1.

The read operation control signal is a signal which is used in the read operation of the semiconductor memory apparatus 1 and is not used in the write operation of the semiconductor memory apparatus 1. The write operation control signal is a signal which is used in the write operation of the semiconductor memory apparatus 1 and is not used in the read operation of the semiconductor memory apparatus 1.

In FIG. 3, the read operation control signal is a read data strobe signal RDQS<0:3>. However, the present invention is not limited to such, and all signals, which are used in the read operation and not used in the write operation, may be used. In FIG. 3, the write operation control signal is a data mask signal DM<0:3>. However, the present invention is not limited to such, and all signals, which are used in the write operation and not used in the read operation, may be used.

As described above, since the read data strobe signal RDQS<0:3> is used only in the read operation of the semiconductor memory apparatus 1 and the data mask signal DM<0:3> is used only in the write operation of the semiconductor memory apparatus 1, even though output of the read data strobe signal RDQS<0:3> and input of the data mask signal DM<0:3> are implemented through the one shared pad 100, collision of the signals does not occur.

The data pad 10 serves as a data input/output path. In the read operation, internal data stored in the semiconductor memory apparatus 1 is outputted to an outside, for example, an external controller, through the data pad 10, and in the write operation, input data from the outside is inputted to the semiconductor memory apparatus 1 through the data pad 10.

The write data strobe pad 30 is configured to receive a write data strobe signal WDQS<0:3> to be used in the write operation of the semiconductor memory apparatus 1.

In FIG. 3, the semiconductor memory apparatus 1 further includes a read data driving unit 11, a write data buffering unit 12, a read data strobe generation unit 101, a data mask signal buffering unit 102, and a write data strobe buffering unit 31.

The read data driving unit 11 is configured to receive through a data input/output line GIO the internal data stored in a memory bank (not shown) of the semiconductor memory apparatus 1, generate output data DQ<0:31> from the internal data, and allows the output data DQ<0:31> to be outputted through the data pad 10. The read data driving unit 11 may include a pipe latch PIPE, a trigger section TRIG and an output data driver DQDRV.

The write data buffering unit 12 is configured to receive input data DQ<0:31> inputted through the data pad 10, generate internal data from the input data DQ<0:31>, and transmit the internal data to the data input/output line GIO. Accordingly, the input data DQ<0:31> transmitted through the data input/output line GIO may be stored in the memory bank of the semiconductor memory apparatus 1. The write data buffering unit 12 may include an input data buffer DQBUF, a delay section DELAY and a data alignment section ALIGN.

The read data strobe generation unit 101 is configured to receive an internal clock signal, for example, a DLL clock dll_clk, and generate the read data strobe signal RDQS<0:3> which is be used in capturing the read data at a receiver, e.g., a memory controller. The read data strobe signal RDQS<0:3> is, according to an example, a signal which is generated at the semiconductor memory apparatus 1 to be activated from a time when the semiconductor memory apparatus 1 outputs data in response to a read command. The read data strobe signal RDQS<0:3> generated from the read data strobe generation unit 101 is outputted to the outside of the semiconductor memory apparatus 1 through the shared pad 100. The read data strobe generation unit 101 may include a trigger section TRIG and a strobe driver DQSDRV.

The data mask signal buffering unit 102 is configured to receive the data mask signal DM<0:3> inputted through the shared pad 100 and generate an internal data mask signal DM_int<0:3>. The data mask signal DM<0:3> is a signal capable of masking the data currently inputted through the data pad 10 so as to prevent the data from being written in the semiconductor memory apparatus 1 when change of data of a memory cell is not required. The data mask signal buffering unit 102 may include a data mask buffer DMBUF, a delay section DELAY and a latch section LATCH.

According to an example, the write data strobe buffering unit 31 is configured to receive the write data strobe signal WDQS<0:3> inputted through the write data strobe pad 30 from the external controller and generate an internal write data strobe signal WDQS_int<0:3>. The internal write data strobe signal WDQS_int<0:3> is activated in response to the write data strobe signal WDQS<0:3> and is applied to the write data buffering unit 12. The write data strobe buffering unit 31 may include a strobe buffer DQSBUF and a delay section DELAY.

Accordingly, in the semiconductor memory apparatus 1 in accordance with the embodiment of the present invention, the shared pad 100 is commonly coupled with the read data strobe generation unit 101 and the data mask signal buffering unit 102. The shared pad 100 outputs the read data strobe signal RDQS<0:3> generated from the read data strobe generation unit 101 in the read operation, and receives the data mask signal DM<0:3>, applied from the external controller and inputted to the data mask signal buffering unit 102, in the write operation.

Figure 4:
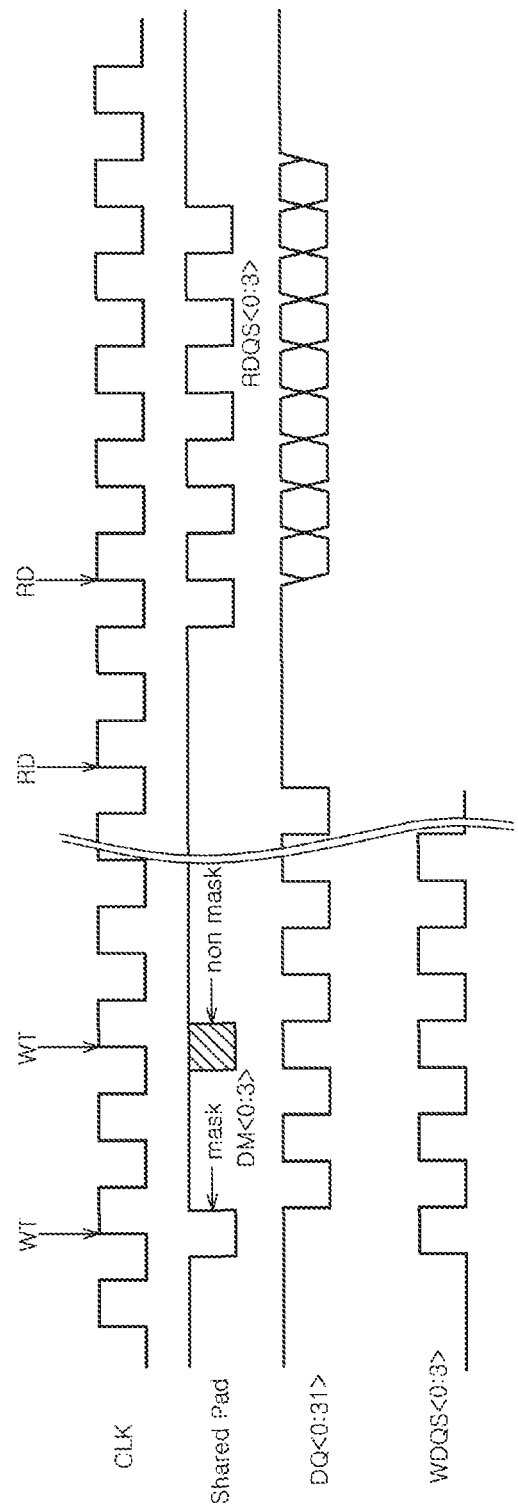
FIG. 4 is a timing diagram illustrating the operations of the semiconductor memory apparatus in accordance with the embodiment of the present invention.

FIG. 4 is a timing diagram illustrating the operations of the semiconductor memory apparatus in accordance with the embodiment of the present invention. Operations of the semiconductor memory apparatus 1 in accordance with the embodiment of the present invention will be described below with reference to FIGS. 3 and 4.

First, when performing the write operation, a write command WT is applied to the semiconductor memory apparatus 1. In FIG. 4, the case of consecutively performing the write operation two times is exemplified. Along with the write command WT, the data mask signal DM<0:3> is inputted through the shared pad 100, the input data DQ<0:31> is inputted through the data pad 10, and the write data strobe signal WDQS<0:3> is inputted through the write data strobe pad 30. The write data buffering unit 12 buffers and aligns the input data DQ<0:31> inputted through the data pad 10, receives the internal data mask signal DM_int<0:3> generated by the data mask signal buffering unit 102, and generates the internal data by determining whether or not to mask the aligned data. In FIG. 4, whether or not to mask currently inputted data is determined depending upon whether or not the data mask signal DM<0:3> is enabled. If the data mask signal DM<0:3> is enabled, the currently inputted data is masked, and if the data mask signal DM<0:3> is disabled, the currently inputted data is not masked. The write data strobe buffering unit 31 receives the write data strobe signal WDQS<0:3> through the write data strobe pad 30 and generates an internal write data strobe signal WDQS_int<0:3>. Accordingly, the write data buffering unit 12 may output aligned internal data in synchronization with the internal write data strobe signal WDQS_int<0:3>. The internal data outputted from write data buffering unit 12 is transmitted to the memory bank of the semiconductor memory apparatus 1 through the data input/output line GIO, and may be written in the memory bank.

Next, when performing the read operation, a read command RD is inputted to the semiconductor memory apparatus 1. In FIG. 4, the case of consecutively performing the read operation two times is exemplified. When performing the read operation, the data mask signal DM<0:3> is not inputted any more. If the read command RD is applied, the read data strobe generation unit 101 receives the internal clock signal dll_clk and generates the read data strobe signal RDQS<0:3>. The read data driving unit 11 receives through the data input/output line GIO the internal data stored in the memory bank of the semiconductor memory apparatus 1, buffers the received internal data, and generates the output data DQ<0:31>. Thereafter, the output data DQ<0:31> is outputted to the external controller of the semiconductor memory apparatus 1 through the data pad 10, and the read data strobe signal RDQS<0:3> may be outputted to the external controller through the shared pad 100.

As described above, the semiconductor memory apparatus in accordance with the embodiment of the present invention commonly uses a pad for outputting a signal used only in the read operation and for receiving a signal used only in the write operation, by which pad utilization efficiency may be improved. Also, by commonly using the pads, the number of entire pads may decrease. Accordingly, a net die may increase, and the circuit area of a semiconductor memory apparatus may be secured.

Figure 5:
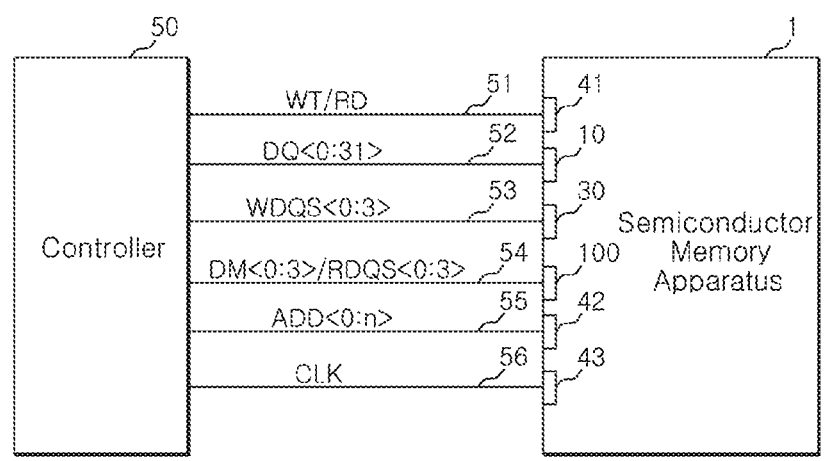
FIG. 5 is a diagram schematically illustrating the configuration of a semiconductor system in accordance with another embodiment of the present invention.

FIG. 5 is a diagram schematically illustrating the configuration of a semiconductor system in accordance with another embodiment of the present invention. In FIG. 5, the semiconductor system 2 includes a controller 50 and a semiconductor memory apparatus 1. The controller 50 and the semiconductor memory apparatus 1 communicate with each other through a plurality of channels. The controller 50 and the semiconductor memory apparatus 1 communicate with each other through a command channel 51, a data channel 52, a write data strobe channel 53, a shared channel 54, an address channel 55, and a clock channel 56. The command channel 51 is a path through which a write command WT and a read command RD are transmitted, and the data channel 52 is a path through which input data or output data DQ<0:31> is transmitted. The write data strobe channel 53 is a path through which a write data strobe signal WDQS<0:3> is transmitted, and the shared channel 54 is a path through which a data mask signal DM<0:3> and a read data strobe signal RDQS<0:3> is transmitted. The address channel 55 is a path through which an address signal ADD<0:n> is transmitted, and the clock channel 56 is a path through which a clock signal CLK is transmitted.

The semiconductor memory apparatus 1 includes a command pad 41 which is coupled with the command channel 51, a data pad 10 which is coupled with the data channel 52, a write data strobe pad 30 which is coupled with the write data strobe channel 53, a shared pad 100 which is coupled with the shared channel 54, an address pad 42 which is coupled with the address channel 55, and a clock pad 43 which is coupled with the clock channel 56.

In a write operation, the address signal ADD<0:n> and the clock signal CLK are transmitted from the controller 50 to the semiconductor memory apparatus 1 through the address channel 55 and the clock channel 56, respectively. The controller 50 also transmits the write command WT through the command channel 51, transmits the input data DQ<0:31> through the data channel 52, transmits the write data strobe signal WDQS<0:3> through the write data strobe channel 53, and transmits the data mask signal DM through the shared channel 54. The semiconductor memory apparatus 1 receives the signals transmitted from the controller 50 through the channels and stores the input data DQ<0:31> therein.

In a read operation, the address signal ADD<0:n> and the clock signal CLK are transmitted from the controller 50 to the semiconductor memory apparatus 1 through the address channel 55 and the clock channel 56, respectively. The controller 50 also transmits the read command RD through the command channel 51. The semiconductor memory apparatus 1 receives the signals transmitted through the channels and generates the output data DQ<0:31> and the read data strobe signal RDQS<0:3>. The semiconductor memory apparatus 1 transmits the output data DQ<0:31> through the data channel 52 to the controller 50, and transmits the read data strobe signal RDQS<0:3> through the shared channel 54 to the controller 50. The semiconductor system 2 in accordance with the embodiment of the present invention transmits the data mask signal DM<0:3> through the shared channel 54 in the write operation, and transmits the read data strobe signal RDQS<0:3> through the shared channel 54 in the read operation. Accordingly, since different signals are transmitted through the same shared channel, the number of channels necessary for communication may decrease.

While certain embodiments have been described above, it will be understood to those skilled in the art that the embodiments described are by way of example only. Accordingly, the semiconductor memory apparatus and the semiconductor system including the same described herein should not be limited based on the described embodiments. Rather, the semiconductor memory apparatus and the semiconductor system including the same described herein should only be limited in light of the claims that follow when taken in conjunction with the above description and accompanying drawings.

What is claimed is:

1. A semiconductor memory apparatus comprising a shared pad configured to output a read operation control signal in a read operation and receive a write operation control signal in a write operation,
wherein the read operation control signal comprises a read data strobe signal used in capturing data, is outputted from the semiconductor memory apparatus, at a receiver.

2. A semiconductor memory apparatus comprising a shared pad configured to output a read operation control signal in a read operation and receive a write operation control signal in a write operation,
wherein the write operation control signal comprises a data mask signal used in masking data to prevent the data from being written in the semiconductor memory apparatus.

3. A semiconductor memory apparatus, comprising:
a shared pad;
a read data strobe generation unit configured to output a read data strobe signal to the shared pad in a read operation; and
a mask signal buffering unit configured to buffer a data mask signal received through the shared pad.

4. The semiconductor memory apparatus according to claim 3, further comprising:
a data pad configured to transmit output data in the read operation and receive input data in the write operation.

5. The semiconductor memory apparatus according to claim 4, further comprising:
a read data driving unit configured to drive the output data in the read operation; and
a write data buffering unit configured to buffer the input data in the write operation.

6. The semiconductor memory apparatus according to claim 3, further comprising:
a write data strobe pad configured to receive a write data strobe signal in the write operation; and
a write data strobe buffering unit configured to buffer the write data strobe signal and output an internal write data strobe signal.

7. A semiconductor memory apparatus comprising:
a shared pad; and
a data pad,
wherein data is outputted through the data pad and a read operation control signal is outputted through the shared pad in a read operation, and
wherein data is received through the data pad and a write operation control signal is received through the shared pad in a write operation.

8. The semiconductor memory apparatus according to claim 7, wherein the read operation control signal comprises a read data strobe signal used in capturing data, is outputted from the semiconductor memory apparatus, at a receiver.

9. The semiconductor memory apparatus according to claim 8, wherein the write operation control signal comprises a data mask signal used in masking data to prevent the data from being written in the semiconductor memory apparatus.

10. A semiconductor system comprising:
a controller configured to receive a read operation control signal in a read operation and transmit a write operation control signal in a write operation; and
a semiconductor memory apparatus configured to transmit the read operation control signal and receive the write operation control signal through a shared pad.

11. The semiconductor system according to claim 10, wherein the read operation control signal comprises a read data strobe signal used in capturing data, is outputted from the semiconductor memory apparatus, at the controller.

12. The semiconductor system according to claim 11, wherein the write operation control signal comprises a data mask signal used in masking data to prevent the data from being written in the semiconductor memory apparatus.

13. A semiconductor system comprising:
a controller configured to transmit a write command, input data, a data mask signal and a write data strobe signal in a write operation, and transmit a read command in a read operation; and
a semiconductor memory apparatus configured to receive the write command, the input data, the data mask signal and the write data strobe signal in the write operation, and receive the read command and transmit output data and a read data strobe signal to the controller in the read operation,
wherein the semiconductor memory apparatus receives the data mask signal and outputs the read data strobe signal through a shared pad.

14. The semiconductor system according to claim 13, wherein the semiconductor memory apparatus comprises a command pad configured to receive the write command and the read command.

15. The semiconductor system according to claim 13, wherein the semiconductor memory apparatus further comprises a data pad configured to receive the input data and transmit the output data.

16. The semiconductor system according to claim 13, wherein the semiconductor memory apparatus further comprises a write data strobe pad configured to receive the write data strobe signal.

17. A semiconductor system comprising:
a controller;
a semiconductor memory apparatus;
a command channel;
a data channel;
a write data strobe channel; and
a shared channel,
wherein, in a write operation, the controller transmits to the semiconductor memory apparatus a write command through the command channel, input data through the data channel, a write data strobe signal through the write data strobe channel, and a data mask signal through the shared channel, and
wherein, in a read operation, the controller transmits to the semiconductor memory apparatus a read command through the command channel and receives from the semiconductor memory apparatus output data through the data channel and a read data strobe signal through the shared channel.

18. The semiconductor system according to claim 17, wherein the data mask signal is a signal which masks the input data to prevent the input data from being written in the semiconductor memory apparatus.

19. The semiconductor system according to claim 17, wherein the read data strobe signal is generated in the semiconductor memory apparatus and is transmitted to the controller to be used in capturing a data.

* * * * *